(12) United States Patent
Tichborne et al.

(10) Patent No.: US 7,988,086 B2
(45) Date of Patent: Aug. 2, 2011

(54) FUEL TANK SYSTEM

(75) Inventors: Franklin George Tichborne, Whitchurch (GB); Kim Michael Ley, Frampton Cotterel (GB)

(73) Assignee: Airbus UK Limited, Bristol (GB)

( * ) Notice: Subject to any disclaimer, the term of this patent is extended or adjusted under 35 U.S.C. 154(b) by 140 days.

(21) Appl. No.: 11/659,414

(22) PCT Filed: Aug. 2, 2005

(86) PCT No.: PCT/GB2005/003026
§ 371 (c)(1),
(2), (4) Date: Feb. 5, 2007

(87) PCT Pub. No.: WO2006/013351
PCT Pub. Date: Feb. 9, 2006

(65) Prior Publication Data
US 2007/0246608 A1    Oct. 25, 2007

(30) Foreign Application Priority Data
Aug. 5, 2004  (GB) .................................. 0417472.8

(51) Int. Cl.
B64D 45/02    (2006.01)
(52) U.S. Cl. ............................ 244/1 A; 361/215; 324/72
(58) Field of Classification Search .............. 244/135 R, 244/135 B, 1 A, 133, 129.1, 136, 171.7, 129.2, 244/172.2; 361/215, 218; 324/457, 72
See application file for complete search history.

(56) References Cited

U.S. PATENT DOCUMENTS

| | | | |
|---|---|---|---|
| 3,747,407 A * | 7/1973 | Wallman | 73/304 C |
| 3,863,238 A * | 1/1975 | Rowell | 340/649 |
| 4,225,899 A | 9/1980 | Sotiriou | |
| 4,259,865 A | 4/1981 | Myers | |
| 4,602,310 A | 7/1986 | Fenster | |
| 4,605,984 A * | 8/1986 | Fiedler | 361/220 |
| 4,971,268 A | 11/1990 | Dobrowski et al. | |

(Continued)

FOREIGN PATENT DOCUMENTS

EP    0 010 861 A1    5/1980
(Continued)

OTHER PUBLICATIONS

"Fuel Tank Ignition Source Prevention Guidelines", May 1, 2002. Federal Aviation Administration, AC 25.981-1C (draft).*

(Continued)

*Primary Examiner* — Tien Dinh
*Assistant Examiner* — Richard R Green
(74) *Attorney, Agent, or Firm* — Patterson Thuente Christensen Pedersen, P.A.

(57) ABSTRACT

Unsafe electric energies can exist in aircraft fuel tanks as a result of static build-up or induced currents from lightning strikes. The invention provides an aircraft fuel tank including two discharge paths for the safe discharge of electricity from the tank before it reaches levels where an arc, spark or other electric discharge, able to ignite fuel in the tank, could occur. The failure of both the discharge paths would significantly increase the risk of an ignition causing electrical discharge occurring. The tank thus also includes a circuit for monitoring the integrity of each discharge path. By having at least two discharge paths, should one discharge path fail (which failure being detected by the monitoring circuit, at least one alternative discharge path exists for the safe discharge of electrical energy from the fuel tank, until the failed discharge path is repaired.

17 Claims, 2 Drawing Sheets

U.S. PATENT DOCUMENTS

| | | | |
|---|---|---|---|
| 5,097,703 A * | 3/1992 | Peter | 73/304 C |
| 5,159,523 A | 10/1992 | Claassen et al. | |
| 5,747,735 A * | 5/1998 | Chang et al. | 174/51 |
| 5,835,322 A | 11/1998 | Smith et al. | |
| 6,141,194 A * | 10/2000 | Maier | 361/58 |
| 6,320,118 B1 * | 11/2001 | Pridham et al. | 174/2 |
| 2002/0101698 A1 | 8/2002 | Bax | |
| 2003/0128493 A1 * | 7/2003 | Nostrand | 361/118 |
| 2004/0011129 A1 | 1/2004 | Gilmour et al. | |

FOREIGN PATENT DOCUMENTS

| | | |
|---|---|---|
| EP | 0 248 122 A2 | 12/1987 |
| EP | 0 312 859 | 10/1988 |
| EP | 0 787 996 A1 | 8/1997 |
| EP | 0 976 653 A1 | 2/2000 |
| GB | 2 356 500 A | 5/2001 |
| GB | 2356500 A * | 5/2001 |

OTHER PUBLICATIONS

Walker et al., "Preventing ignition sources inside fuel tanks," *Fast 33* (*Flight Airworthiness Support Technology*), (Dec. 2003). (http://www.content.airbusworld.com/SITES/Customer_services/html/acrobat/fast_33_p23_33igintion.pdf).

"Fundamentals of ESD, Part One—An Introduction to ESD", ESD Association, Jun. 2001 (11 pg.).

"PROTEKTIVE PAK—Conductive Foam" (http://www.stanleysupplyservices.com/product-group/3042), prior to Aug. 5, 2004.

Botron Conductive Foam (http://esda.org/basics/part1.cfm), prior to Aug. 5, 2004.

* cited by examiner

FUEL TANK SYSTEM

RELATED APPLICATIONS

The present application is a National Phase entry of PCT Application No. PCT/GB2005/003026, filed Aug. 2, 2005, which claims priority from, United Kingdom Application Number 0417472.8, filed Aug. 5, 2004, the disclosures of which are hereby incorporated by reference herein in their entirety.

TECHNICAL FIELD

The present invention relates to aircraft fuel tanks, and particularly but not exclusively, to aircraft fuel tanks made out of composite materials.

BACKGROUND OF THE INVENTION

During flight, undesirable electrical energy can build up in aircraft fuel tanks. This can be in the form of static electricity or electrical energies induced in the tank due to a lightning strike. If this energy is allowed to build to a great enough level then there exists a significant risk of an ignition event occurring in which the aircraft fuel, in particular fuel vapour, in the fuel tanks will ignite. It is thus desirable to limit the amount of electrical energy that is able to exist within the tank.

Fuel tanks of the prior art made of metal typically offer a certain amount of protection from lightning by virtue of the tank acting as a Faraday cage. However, composite fuel tanks do not afford such inherent protection. Such a disadvantage of composite fuel tanks can, to a limited extent, be mitigated by means of having a metallic mesh embedded within the composite structure. However, such measures provide little protection in the case of larger composite fuel tanks, where in-tank conductive components increase the risk of an ignition event resulting from lightning. That risk can be reduced by insulating the in-tank conductive components, but that can increase the risk of static charge build-up becoming hazardous.

Fuel tank safety has over recent years been recognised as being particularly important in maintaining aircraft safety. Various regulations have been laid down by the relevant official bodies governing aircraft design. For example, the FAA (the US Federal Aviation Administration) has set various criteria for fuel tank design in aircraft in Special Federal Aviation Regulation (SFAR) No. 88. It is of course highly desirable for any modifications or improvements of fuel tank design to be compatible with (SFAR) No. 88 and/or any similar regulations in other countries or which supersede (SFAR) No. 88.

Due to the potentially catastrophic consequences, should an ignition event occur in an aircraft fuel tank, whatever means used for reducing the level of the risk on the level of electrical energy within the tank should ideally be highly reliable. It is desirable for example that these means should be of a safety-critical nature. For example, the means should preferably be in the form of a fail-safe system.

One safety system of a fuel tank of the prior art simply comprises one or more discharge paths from the fuel tank to the aircraft ground, in the form of grounding straps mechanically bonded to the tank and to the aircraft structure. Such straps are required to be routinely manually visually inspected to ensure that the local bonding points maintain good conductive contact. Such manual checks can only be performed when the aircraft is stationary and grounded and are not especially reliable.

The present invention seeks to provide a fuel tank with improved safety features and/or a fuel tank, which mitigates one or more of the problems or disadvantageous features of the prior art mentioned above and/or meets one or more of the above-mentioned criteria that it would be desirable to satisfy.

SUMMARY OF THE INVENTION

The present invention provides an aircraft comprising a fuel tank, wherein the fuel tank includes a discharge path for the safe discharge of electricity from the fuel tank and a monitoring circuit for monitoring the integrity of the discharge path.

The discharge path is preferably arranged to facilitate the discharge of electricity from within the tank. The discharge path may be arranged to facilitate the discharge of static electricity. The discharge path is preferably arranged to facilitate the discharge of electricity, for example electrical transients, induced by environmental conditions, such as for example lightning or radiation. The impedance of the discharge path is preferably high enough to reduce the maximum electrical discharge energy able to be induced in the tank by lightning to an acceptable level, but low enough to allow a flow of current sufficient to prevent static electricity from building up to a dangerous level. Preferably the discharge path is of relatively high impedance. In certain embodiments of the present invention, at least part of the discharge path is of relatively high impedance. The impedance of at least part of the discharge path may for example be greater than 5 k$\Omega$. The impedance may be less than 1 M$\Omega$. Thus static electricity in the fuel tank is able to be discharged through the discharge path to the aircraft ground before it builds up to an unsafe level. Also, if the fuel tank is struck by lightning, electrical energy induced within the tank may be discharged through the discharge path to the aircraft ground. Moreover, embodiments of the present invention increase safety by means of the discharge path being arranged such that in use it is able to be monitored so that the condition of the discharge path may be known, for example providing up-to-date information regarding the integrity of the discharge path, the information possibly being provided far more frequently and being more accurate than the relatively infrequent manual routine inspections.

The fuel tank may be so arranged that static electricity in the fuel tank is prevented from building up to a level where an unsafe electrical discharge might occur. Any event caused by flow of electricity that has the capacity to ignite fuel in the tank may be considered as an unsafe electrical discharge and, as such, high energy electrical arcs and sparks are both examples of unsafe electrical discharges.

The fuel tank may be so arranged that electricity induced by environmental conditions is limited so as to prevent an unsafe electrical discharge. FAA regulations, such as set out in Special Federal Aviation Regulation (SFAR) No. 88, require that the fuel tank be designed such that sparks or arcs with an energy greater than 200 µJ are prevented from occurring in the fuel tank. Thus, the discharge path is conveniently arranged to allow the discharge of electricity, whilst not creating any non-negligible risk of a spark or arc having an energy greater than 200 µJ occurring. Provided that the discharge path meets this requirement it can be considered as providing for the safe discharge of electricity. Thus, the term "unsafe electrical discharge" may exclude discharges having energies less than 200 µJ.

The discharge path may be considered as having integrity if the path retains the ability to provide a safe discharge of electricity from within the fuel tank.

In certain embodiments of the invention there may be at least two discharge paths for the safe discharge of electricity from the fuel tank. Preferably, the integrity of these at least two discharge paths is monitored by the monitoring circuit. Preferably, said at least two discharge paths have separate bond points to a part of the aircraft that is securely and reliably in conductive communication with the aircraft electrical ground.

The fuel tank may include at least one fuel measurement sensor. A multiplicity of such fuel measurement sensors may be provided in the fuel tank. The or each fuel measurement sensor is preferably in the form of a probe from which an electronic signal dependent on a measurable characteristic of fuel in the tank can be derived. The measurable characteristic may for example be the level of fuel in the tank, the density of fuel in the tank, the temperature of fuel in the tank or any other characteristic that it might be useful to measure. Thus, the fuel measurement sensor may be in the form of a capacitance probe. The use of such capacitance probes is well known in the art of aircraft fuel measurement systems. The fuel measurement sensor may be in the form of a temperature sensor. The fuel measurement sensor may be in the form of a densitometer. The conductive parts of the fuel measurement sensor may be electrically isolated from the main structural walls that define the fuel tank. At least some of the electrically conducting parts of the fuel measurement sensor are electrically insulated from direct contact with fuel in the fuel tank. The fuel measurement sensor may include wiring leading from the main body of the sensor out of the tank. Insulating or otherwise isolating the fuel measurement sensor may reduce the risk of unsafe electrical discharges resulting from lightning, but may also increase the likelihood of static electricity build-up in the tank.

The wiring leading from the fuel measurement sensor may be longer than 2 metres. The wiring may be longer than 3 metres. In large aircraft, having relatively long fuel tanks, the wiring may be longer than 4 metres or may be 5 metres or longer. Wiring may typically be any length from 1 m to 20 m. There may also be other wires within the tank. All conductive wires and the like within the fuel tank may collectively be referred to as the in-tank wiring.

Preferably, the fuel tank is so arranged that there is no low impedance path from the fuel measurement sensor in the fuel tank to aircraft ground. For example, the fuel tank may be designed such that, in the absence of any faults, there is no conductive path from the probe to ground having an impedance lower than that of the lowest impedance monitored discharge path. It is preferred that the impedance of any unmonitored conductive path between the probe and aircraft ground is not low enough to pose a risk of there being an unsafe electrical discharge as a result of lightning.

The present invention has particular application when the fuel tank is mostly non-metallic. For example, greater than 50% by volume of the tank may be non-metallic. The fuel tank may for example be in the form of a tank made mostly from composite fibre material, for example carbon fibre based composite material. The fuel tank structure may therefore have relatively high impedance compared to a metallic fuel tank. As such, the fuel tank may be more susceptible, if suitable measures (such as implementing the present invention) are not taken, to unsafe electrical discharges caused by lightning. The fuel tank, whilst being mostly non-metallic, may be provided with a Faraday cage structure, which may for example be in the form of a metallic mesh embedded within the composite fibre structure that defines the fuel tank.

The monitoring circuit is preferably arranged to detect a change in impedance. The monitoring circuit may be arranged such that if the impedance of the discharge path as measured by the circuit is outside a preset range of impedances then the circuit makes an output indicating that the integrity of the discharge path cannot be guaranteed. For example, in such a case the circuit may stop issuing an "OK" signal or may issue a fault signal. Preferably, the monitoring circuit uses a low current to monitor the integrity of the discharge paths. A current of less than 10 mA may be considered as a low current in this context. In certain embodiments of the present invention, the monitoring circuit may be arranged to detect whether a discharge path has shorted, so that for example current can pass from the fuel tank to the aircraft ground via a path having an impedance significantly lower than that of the monitored discharge path when integral, whether or not the low impedance path comprises a part of the discharge path. The monitoring circuit may be arranged to detect whether a discharge path has become open circuit, so that for example the flow of current from the fuel tank to aircraft ground via the discharge path is restricted, or even prevented.

The monitoring circuit may be so arranged that it is supplied by electrical power that may be considered as being effectively electrically isolated. The monitoring circuit may be so arranged that an output of the monitoring circuit may be considered as being effectively electrically isolated.

For example, the monitoring circuit may be optically powered. For example, light may be converted into electrical power in a region local to the fuel tank. It is preferred that the monitoring circuit has an optical output. For example, electrical outputs may be converted into light signals in a region local to the fuel tank. Thus, electric signals and the associated cables may be located only in a region local to the fuel tank. Optical fibre cables may carry signals from the monitoring circuit. Such optical cables may link the monitoring circuit to a central control unit (such as for example a Central Maintenance System) of the aircraft. In certain embodiments of the invention, the monitoring circuit sends an output signal to the central control unit, which is logged by the central control unit, should the integrity of a discharge path be deemed to be compromised. As a result of the logging of the potential fault by the central control unit, the potential fault can then be brought to the attention of ground crew during maintenance of the aircraft, for example. In an embodiment of the invention described below the monitoring circuit is optically powered and has an optical output, the output indicating whether or not a discharge path is deemed to have integrity.

The monitoring circuit may be local to the fuel tank (e.g. physically positioned locally). The monitoring circuit may be housed in an enclosure, the enclosure being attached to the aircraft structure. The enclosure may be in the form of a dedicated housing, for example a box. The monitoring circuit enclosure may be made from conductive material, for example metal. Preferably, the monitoring circuit enclosure is connected to a wall of the fuel tank. The monitoring circuit enclosure may be conductive. The circuit monitoring enclosure may be grounded, preferably to the aircraft ground. The circuit enclosure is preferably attached directly to the fuel tank wall, there being conductive contact therebetween. In the case of a carbon fibre tank, the monitoring circuit enclosure may be connected to a lightning deflection conductor on the tank. Preferably, there is a conductive strap, preferably of high integrity, from the fuel tank to the monitoring circuit enclosure. The or each discharge path may be arranged to conduct electricity via the circuit enclosure to the aircraft ground.

The fuel tank may be arranged such that the maximum energy able to be produced in an electrical discharge in the tank is less than 200 μJ. It is desirable for the maximum energy able to be produced in an electrical discharge to be lower if achievable. It is preferable that the fuel tank is arranged such that the maximum energy able to be produced in a discharge is less than 50 μJ. More preferably the fuel tank is arranged such that the maximum energy able to be produced in a discharge is less than 20 μJ.

The fuel tank may be arranged such that under fault conditions the maximum current possible in the tank is less than 30 mA. Preferably the fuel tank is arranged such that the maximum current used in the tank is less than 10 mA. Even more preferably the fuel tank is arranged such that the maximum current used in the fuel tank is about 1 mA or less. The fuel tank may also be arranged such that there is also a limit on currents introduced into the tank by means other than those necessary for the aircraft to operate. For example, currents may be induced during lightning strikes and it is preferred that the fuel tank design limits the amounts of those induced currents.

The invention also provides a fuel tank for an aircraft, wherein the fuel tank includes a discharge path for the safe discharge of static electricity from the fuel tank and a monitoring circuit for monitoring the integrity of the discharge path.

The invention further provides a method of monitoring the integrity of a discharge path for the safe discharge of electricity from an aircraft fuel tank. There is for example provided a method of monitoring the safe discharge of electricity from an aircraft fuel tank, the method comprising a step of providing a discharge path for the safe discharge of electricity in the fuel tank and a step of monitoring the discharge path with a monitoring circuit.

The fuel tank of the method may include a fuel measurement sensor. The fuel measurement sensor may be connected to a fuel level measuring circuit, for example via isolated circuitry of the measuring circuit. The measuring circuit may include a signal generator and a signal receiver for sending signals between the measuring circuit and the fuel monitoring sensor. The monitoring circuit is preferably accommodated in a metal circuit box. The signal generator and signal receiver may be located local to the fuel tank for example in a metal box for example located on the external wall of the fuel tank. That box may also accommodate the monitoring circuit.

The fuel tank of the method may include two discharge paths connected to the aircraft ground for the discharge of electricity from the fuel tank, so that if one of the discharge paths should fail then the other discharge path will still provide for the safe discharge of electricity from the tank. Importantly, it may be necessary for there to be provided a conductive strap, preferably a strap of high integrity, connected between the fuel tank and the metal circuit box. Preferably, the two discharge paths are each connected between the metal circuit box and a part within the fuel tank that is susceptible to static build up, for example, any insulated in-tank wiring and electronic components. The integrity of the two discharge paths is preferably monitored by the same monitoring circuit. The monitoring circuit may be considered as including a loop encompassing both discharge paths, wherein a small current is passed around the loop such that if the integrity of one of the discharge paths is compromised, then a change in the current is detected, and the output of the monitoring circuit triggers a warning signal. In a case where the integrity of one only of the discharge paths is compromised, a warning may be triggered, even though there still exists a safe discharge path.

There is still further provided a monitoring circuit for monitoring the integrity of a discharge path, wherein the discharge path enables the safe discharge of electricity from an aircraft fuel tank.

The invention also provides a kit of parts for converting an existing aircraft into an aircraft according to any aspect of the present invention. Preferably, the kit comprises a monitoring circuit including the features as required by any aspect of the invention described herein. The monitoring circuit may be housed in an enclosure, for example a box, for mounting next to, or more preferably in contact with, a fuel tank of an aircraft. The monitoring circuit preferably includes at least a part of the discharge path, for example a part having a relatively high impedance.

It will of course be appreciated that features described in relation to one aspect of the invention may, where appropriate, be incorporated into another aspect of the invention. For example, features relating to the aircraft of the invention may be incorporated into the method of the invention. Also, features described in relation to the fuel tank of the aircraft of the invention may be incorporated into the aircraft fuel tank of the invention.

BRIEF DESCRIPTION OF THE DRAWINGS

An embodiment of the present invention will now be described by way of example with reference to the accompanying schematic drawings of which.

DETAILED DESCRIPTION

Figure 1:
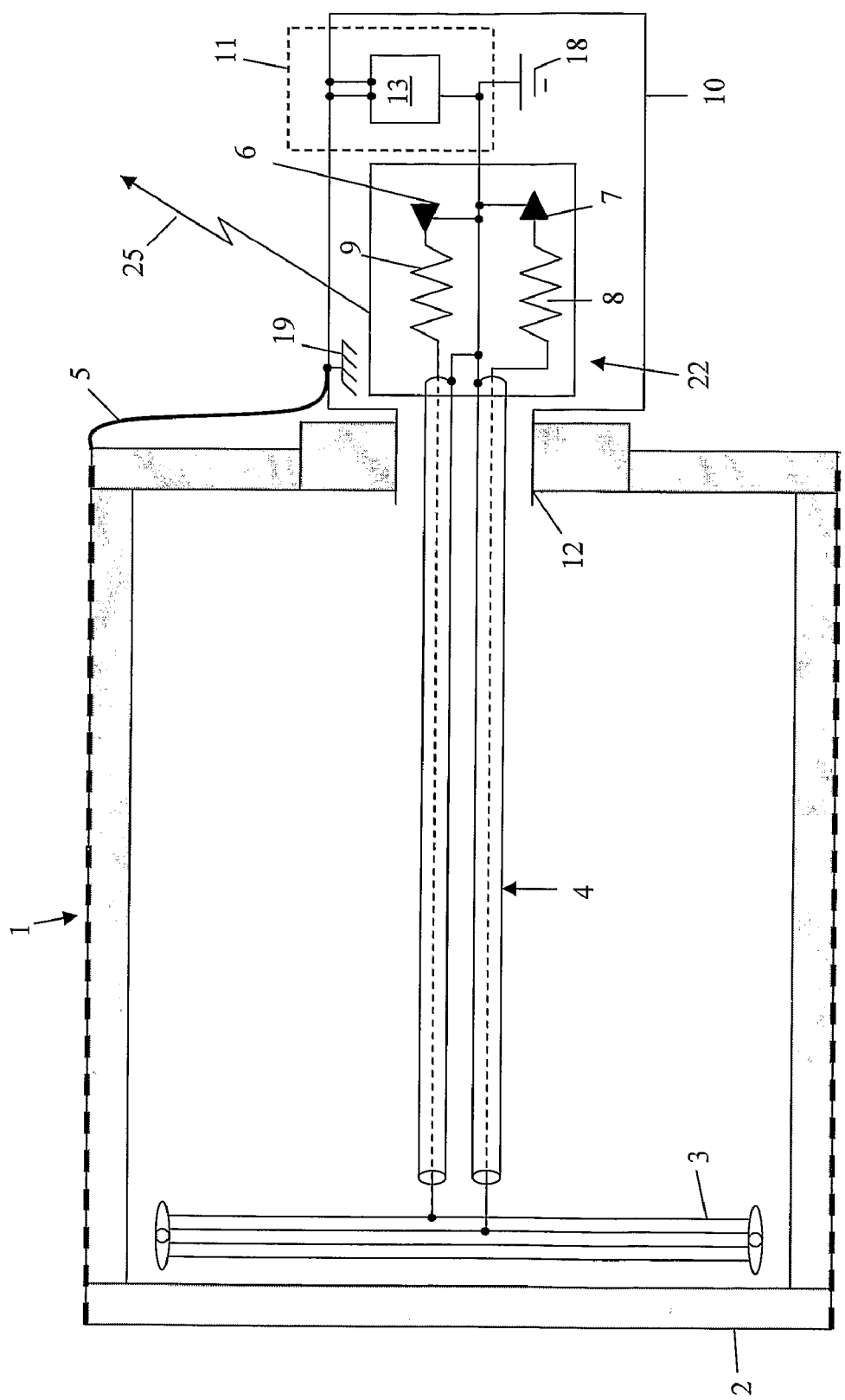
FIG. 1 shows a fuel probe and a fuel tank.

FIG. 1 shows a carbon fibre reinforced composite material fuel tank 1 formed in an aircraft wing. The tank, being defined by the shape of the wing-box in a region covering several ribs in the wing, has a complex geometry, but is about 5 metres in length in the spanwise direction. The composite material defining the space in which fuel may be held in the fuel tank includes a fine metallic mesh embedded therein which thus provides a metallic cage around the fuel, which forms a Faraday cage structure offering some protection against the induction of currents in the fuel tank from environmental conditions such as lightning.

Inside the tank 1 there are provided many fuel probes 3 (only one of which is shown in FIG. 1) and a circuit 22 for measuring the level of fuel present in the tank 1. The fuel probes are each positioned at different locations within the tank 1. The fuel probes comprise fuel level probes, thermometers and densitometers, as is standard practice in certain aircraft fuel tanks. The illustrated fuel probe is in the form of an insulated capacitance probe 3 comprising two concentric conductive tubes. The capacitance probes 3 are connected to the same fuel measuring circuit 22 which is housed in a metal circuit box 10 attached to, but positioned predominantly outside the fuel tank 1. (The fuel measuring circuit 22 may therefore be considered as a tank wall processor.) Each capacitance probe 3 is connected to the circuit 22 via two isolated wires 4 which are effectively substantially electrically insulated from the surrounding fuel except at the probe terminals (the probe terminals typically being in the fuel). Insulation from the fuel is not necessary to ensure correct operation or safety as the fuel is a poor conductor, but rather to reduce the potential for unsafe electrical discharge resulting from induced currents. (Although both wires 4 are shown as shielded, it will be appreciated that one of the wires could be shielded, with the other wire not being shielded.)

The fuel measuring circuit 22 also includes a signal generator 6 and a signal receiver 7, connected to the in-tank wiring 4 via two resistors 8 and 9. The fuel measuring circuit 22 is powered by a safe isolated electrical source including an A.C. transformer (not shown), which outputs approximately 1.0 Watts electrical energy. The signal receiver 7 includes a capacitor (not separately shown) with a fixed capacitance such that the capacitance probe 3 and the fixed capacitance capacitor form a potential divider, from which a measure of the changing capacitance of the capacitance probe 3 may be derived. Optical output signals are sent from the fuel measuring circuit, the signals including optical signals from which the amount of fuel in the tank 1 can be ascertained. The optical outputs associated with the circuit are represented schematically in FIG. 1 by means of arrow 25.

During operation, an A.C. wave signal having a peak current of about 1 mA is generated in the signal generator 6 and sent through a first resistor 9 down through the in-tank wiring 4 to each respective capacitance probe 3. All of the probes 3 in the tank are excited in this manner by a common signal source. As aircraft fuel is a dielectric, when the level of fuel in the concentric tubes of the probe changes, the capacitance of the probe changes. The signal wave passes from the capacitance probe 3 through the in-tank wiring 4 and the second resistor 8 to the signal receiver 7. The peak-to-peak potential difference of the A.C. wave across the fixed capacitor of the signal receiver 7 changes in dependence on the fuel level in the capacitance probe. The signals from the respective capacitance probes are multiplexed to allow separation of the returned signals. These electrical signals in the signal receiver are converted into multiplexed optical output signals that are transmitted via fibre optic cable (not shown) to a central fuel quantity management system (not shown).

The central fuel quantity management system receives multiplexed signals from the signal measuring circuit associated with each respective fuel tank of the aircraft. In respect of each tank, the fuel quantity management system processes the received signals to ascertain the individual fuel levels measured by the probes and then calculates the amount of fuel in the tank.

The fuel probe 3, its associated in-tank wiring 4 and the fuel measuring circuitry 22 are considered as being effectively isolated from the fuel tank structure (its walls 2) and the circuit box 10. As can be seen in FIG. 1, there is a conductive strap 5 from the fuel tank wall 2 to the metal circuit box 10 and the metal circuit box is also connected to the tank walls 2 at the point where there is an aperture 12 in the walls to allow the in-tank circuitry 4 to connect to the capacitance probe 3. The metal circuit box 10 is connected directly to the aircraft ground circuit. Thus, the tank walls 2 are also connected directly to the aircraft ground circuit. The insulation on the in-tank wiring 4 and the fuel measuring circuit is grounded to a separate common ground 18 (hereinafter referred to as the tank circuit ground 18) distinct from the aircraft ground 19.

The wires 4 from the probes 3 in the tank 1 to the circuit box 10 range in length (up to a typical maximum of 5 metres, but perhaps as long as 20 m in some cases) depending on the position of the probe concerned and tank configuration. As the length of the in-tank wiring increases so does the maximum energy of likely electrical discharges arising from lightning strikes. At such lengths, it is important that there is no low impedance path between the in-tank wiring and the aircraft ground, as any such low impedance path would increase the risk of unsafe electrical discharges occurring in the tank.

By increasing the impedance between the in-tank wiring and the aircraft ground the maximum energy likely to be discharged in a hazardous manner in the tank resulting from currents induced by lightning may be reduced. However, if the in-tank wiring is completely isolated from the aircraft ground there would be a significant increase in the risk of static electricity building up to a level at which an unsafe electrical discharge of static electricity is possible.

To provide adequate protection against unsafe electrical discharges arising in the fuel tank as a result either of static build-up or as a result of electrical transients resulting from lightning an active protection circuit 11 is provided (the circuit 11 includes various components represented schematically in FIG. 1 by means of box 13). The active protection circuit 11 provides, as is shown schematically in FIG. 1 and in more detail in FIG. 2, two independent discharge paths for the safe discharge of electricity from within the fuel tank via the tank circuit ground 18 to the aircraft ground 19, without significantly increasing the level of energies able to be induced within the fuel tank 1 by lightning.

Figure 2:
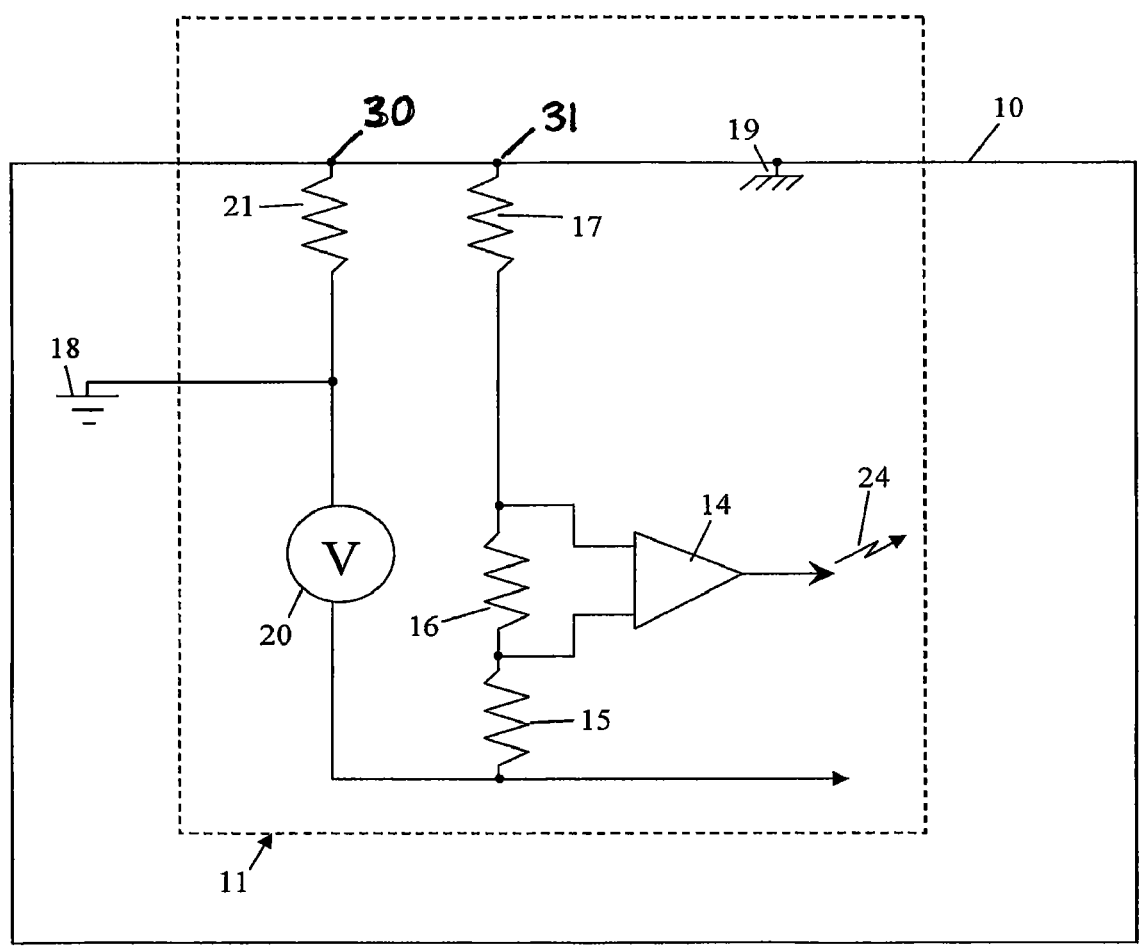
FIG. 2 shows an actively monitored discharge circuit associated with the fuel tank.

FIG. 2 shows the active protection circuit 11 in more detail. The active protection circuit includes two electric discharge paths between the aircraft ground and a monitoring circuit for monitoring the integrity of the discharge paths. The metal circuit box 10 housing the measuring circuit (not shown in FIG. 2 for the sake of clarity) and the active protection circuit is in conductive contact with the aircraft ground by means of being screwed down with metal screws or bolted with nut washer and bolt onto the aircraft frame structure at several separate locations on the structure, which structure is in conductive contact with the rest of the grounded structure of the aircraft. The circuit box 10 is also separately bonded to the aircraft structure by reinforced bonding paths/straps. Thus, the metal box 10 can be considered to be an inherently reliable contact for the aircraft ground circuit. A first discharge path is formed by means of a single 10 k.OMEGA. resistor 21 (hereinafter the "first resistor" 21) connected between the tank circuit ground 18 and a first bond point 30 on the metal box 10 (i.e. equal to the aircraft ground 19). A second discharge path is formed by means of a route from the tank circuit ground 18 to a second bond point 31 on the metal box 10 (i.e. equal to the aircraft ground 19) that passes, in order and in series, via a power source 20, a second (1 k.OMEGA.) resistor 15, a combination of a third (0.5 k.OMEGA.) resistor 16 arranged in parallel with a signal detector 14, and a fourth (100 k.OMEGA.) resistor 17. The two discharge paths are actively monitored by the active protection circuit 11. The power source 20 generates a current of about 100.mu.A. Thus a small current is circulated around a loop in the monitoring circuit, the loop being formed by means of discharge paths and the metal box 10. A small proportion of the current passing around the loop passes through the signal detector 14 (which effectively measures the potential difference across the third resistor 16), which converts the current into an optical signal 24 representative of the current level passing around the loop. This optical signal is fed to the processor of a central processing unit in the Aircraft Central Maintenance System of the aircraft. Should one of the two monitored discharge paths to ground become open or short circuit then there would be a change of current passing around the loop monitored by the monitoring circuit. This change of current would be measured by the signal detector 14 and reflected by a change in the optical signal sent, this change being logged by the aircraft's Central Maintenance System, which during maintenance of the aircraft provides a warning of a potential compromise of the integrity of the or each discharge path. If only one of the two discharge paths is compromised then an appropriate warning signal is issued and logged by the Central Maintenance System, but the circuit still offers a second possible path for the safe discharge of electric charge between the tank circuit ground 18 and the aircraft ground 19. For example, if the pathway including the first resistor 21 goes open circuit, then discharge of electricity is still facilitated by the pathway including resistors 15, 16, 17. Also, the current through the signal detector 14 would decrease to zero and the central processing unit would detect a fault in the monitored loop. If there is a short circuit between the tank circuit ground 18 and the aircraft circuit ground, for example if the first resistor 21 shorts, there is an increased susceptibility to lightning strike, but the current flowing through the second, third, and fourth resistors 15, 16, 17 increases, leading to an increase in the signals sent by the signal detector 14, which would be detected, resulting in an appropriate signal being sent to the aircraft Central Maintenance System, which would again log the possibility of a potential fault. Such a short circuit might exist in the event of any of the in-tank components, including the capacitance probe 3 and the in-tank wiring 4, shorting to the fuel tank wall 2 or another part of the tank structure connected directly to the aircraft ground 19. In the event of such a short circuit, increased current would flow through the second, third, and fourth resistors possibly including current from the fuel level measuring circuit, which would be detected by the signal detector 14.

If any of the second to fourth resistors 15, 16, 17 go short circuit, then in a manner similar to the case where the first resistor shorts there will be an increase in current (the exact amount of the increase depending on the particular resistor, allowing the control unit to distinguish between a short circuit in one resistor from a short circuit in another) which will be detected by the control unit.

Also, if any part of the pathway between the tank circuit ground 18 and the aircraft ground 19 including the second to fourth resistors 15, 16, 17 goes open circuit, then discharge of electricity is still facilitated by the pathway including the first resistor 21. The current through the signal detector 14 would of course also decrease to zero and the monitoring circuit would detect a fault in the monitored loop.

As a result of providing two separate and predominantly independent discharge paths bonded to the metal box at two separate and spaced apart locations means that if one discharge path is compromised it is likely that the other discharge path will remain effective, thus providing the active protection circuit with a fall-back safety mechanism (or dual redundancy).

The arrangement of the tank, the in-tank wiring, the fuel measuring circuit and the active protection circuit is such that the maximum discharge energy of a spark or arc resulting from induced currents from lightning, or other environmental conditions that might induce such currents, is never likely to exceed 20 µJ. Also, the arrangement is such that electrical currents within the tank are never likely to exceed 1 mA.

Whilst the present invention has been described and illustrated with reference to a particular embodiment, it will be appreciated by those of ordinary skill in the art that the invention lends itself to many different variations not specifically illustrated herein. By way of example, the fuel tank could be metallic, as opposed to being formed of composite material.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims.

The invention claimed is:

1. A fuel tank for an aircraft, wherein the fuel tank includes in-tank wiring connected to a first discharge path and a second discharge path, said first and second discharge paths being for the safe discharge from within the fuel tank of static electricity or electricity induced by environmental conditions to an aircraft electrical ground, and a monitoring circuit for monitoring the integrity of the first and second discharge paths, the monitoring circuit being housed in a conductive enclosure, said conductive enclosure being provided with a conductor for electrical connection to an aircraft electrical ground, the first discharge path extending from a fuel tank circuit ground through a first resistor and being bonded to a first contact point on the conductive enclosure, the second discharge path extending from said fuel tank circuit ground through a second resistor and being bonded to a second contact point on the conductive enclosure, and the first discharge path, the second discharge path and the conductive enclosure form a loop which permits the integrity of the first and second discharge paths to be monitored by the monitoring circuit.

2. A fuel tank as claimed in claim 1 wherein the monitoring circuit is arranged to detect a change in impedance.

3. A fuel tank as claimed in claim 1 wherein the fuel tank includes at least one fuel measurement sensor, the at least one fuel measurement sensor being grounded to the fuel tank circuit ground.

4. A fuel tank as claimed in claim 1 wherein the impedance of the first and second discharge paths are mutually different, and each of the said first and second discharge paths has an impedance of from 5 kΩ to 1 MΩ.

5. A fuel tank as claimed in claim 1, wherein the first and second discharge paths are arranged to enable safe discharge from an in tank conductive component.

6. A fuel tank as claimed in claim 1, wherein the first and second discharge paths are arranged to enable safe discharge from a part within the fuel tank that is susceptible to static build up.

7. A fuel tank as claimed in claim 1, wherein the fuel tank includes at least one fuel measurement sensor and the first and second discharge paths are arranged to enable safe discharge from the fuel measurement sensor.

8. A fuel tank as claimed in claim 1, the loop being provided with a power source for generating a circulating current through the loop, the monitoring circuit being arranged to monitor the current circulating through the loop.

9. A fuel tank as claimed in claim 1, the loop being provided with a power source for generating a circulating current through the loop, the monitoring circuit being arranged to monitor the current circulating through the loop, changes in the circulating current being indicative of one or more of:

(a) a change in the integrity of the first and/or second discharge path;

(b) a short circuit between said fuel tank circuit ground and said aircraft electrical ground; and (c) an in-tank short circuit.

10. A fuel tank as claimed in claim 1, the loop being provided with a signal detector.

11. An aircraft having an aircraft electrical ground and comprising a fuel tank, the fuel tank including in-tank wiring connected to a first discharge path and a second discharge path, said first and second discharge paths being for the safe discharge from within the fuel tank of static electricity or electricity induced by environmental conditions to said aircraft electrical ground, and a monitoring circuit for monitoring the integrity of the first and second discharge paths, the monitoring circuit being housed in a conductive enclosure, said conductive enclosure being electrically connected to said aircraft electrical ground, the first discharge path extending from a fuel tank circuit ground through a first resistor and being bonded to a first contact point on the conductive enclosure, the second discharge path extending from said fuel tank circuit ground through a second resistor and being bonded to a second contact point on the conductive enclosure, and the first discharge path, the second discharge path and the conductive enclosure form a loop which permits the integrity of the first and second discharge paths to be monitored by the monitoring circuit.

12. An aircraft as claimed in claim 11, the loop being provided with a power source for generating a circulating current through the loop.

13. An aircraft as claimed in claim 11, the loop being provided with a power source for generating a circulating current through the loop, the monitoring circuit being arranged to monitor the current circulating through the loop, changes in the circulating current being indicative of one or more of:
   (a) a change in the integrity of the first and/or second discharge path;
   (b) a short circuit between said fuel tank circuit ground and said aircraft electrical ground; and
   (c) an in-tank short circuit.

14. An aircraft as claimed in claim 11, the loop being provided with a signal detector.

15. A method of monitoring the safe discharge of electricity from an aircraft fuel tank, the method comprising the steps of
   Providing an aircraft having an aircraft electrical ground
   Providing a fuel tank having in-tank wiring and a fuel tank circuit ground, the in-tank wiring being connected to a first discharge path and a second discharge path, said first and second discharge paths being for the safe discharge from within the fuel tank of static electricity or electricity induced by environmental conditions to said aircraft electrical ground,
   Providing a monitoring circuit for monitoring the integrity of the first and second discharge paths, the monitoring circuit being housed in a conductive enclosure, said conductive enclosure being electrically connected to the aircraft electrical ground; the first discharge path extending from a fuel tank circuit ground through a first resistor and being bonded to a first contact point on the conductive enclosure; and the second discharge path extending from said fuel tank circuit ground through a second resistor and being bonded to a second contact point on the conductive enclosure; the first discharge path, the second discharge path and the conductive enclosure form a loop which permits the integrity of the first and second discharge paths to be monitored by the monitoring circuit; and
   Monitoring the integrity of the first and the second discharge paths with the monitoring circuit.

16. A method of monitoring the safe discharge of electricity from an aircraft fuel tank, the method comprising the steps of
   Providing an aircraft having an aircraft electrical ground
   Providing a fuel tank having in-tank wiring and a fuel tank circuit ground, the in-tank wiring being connected to a first discharge path and a second discharge path, said first and second discharge paths being for the safe discharge from within the fuel tank of static electricity or electricity induced by environmental conditions to said aircraft electrical ground,
   Providing a monitoring circuit for monitoring the integrity of the first and second discharge paths, the monitoring circuit being housed in a conductive enclosure, said conductive enclosure being electrically connected to the aircraft electrical ground; the first discharge path extending from a fuel tank circuit ground through a first resistor and being bonded to a first contact point on the conductive enclosure; and the second discharge path extending from said fuel tank circuit ground through a second resistor and being bonded to a second contact point on the conductive enclosure; the first discharge path, the second discharge path and the conductive enclosure forming a loop which permits the integrity of the first and second discharge paths to be monitored by the monitoring circuit;
   Providing a power source for generating a circulating current through the loop; and
   Monitoring the current circulating through the loop with the monitoring circuit.

17. The method of claim 16, wherein a change in the circulating current is indicative of one or more of:
   (a) a change in the integrity of the first and/or second discharge path;
   (b) a short circuit between said fuel tank circuit ground and said aircraft electrical ground; and
   (c) an in-tank short circuit.

* * * * *